(12) United States Patent
Makabe et al.

(10) Patent No.: US 7,776,686 B2
(45) Date of Patent: Aug. 17, 2010

(54) METHOD OF FABRICATING A NON-VOLATILE MEMORY ELEMENT INCLUDING NITRIDING AND OXIDATION OF AN INSULATING FILM

(75) Inventors: Mariko Makabe, Kanagawa (JP); Eiji Hasegawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 349 days.

(21) Appl. No.: 11/368,635

(22) Filed: Mar. 7, 2006

(65) Prior Publication Data

US 2006/0205155 A1    Sep. 14, 2006

(30) Foreign Application Priority Data

Mar. 8, 2005    (JP)    ............................. 2005-064628

(51) Int. Cl.
    *H01L 21/336*    (2006.01)
(52) U.S. Cl. ................ 438/257; 257/315; 257/E29.129
(58) Field of Classification Search ................ 438/257, 438/261, 769, 770, 775
    See application file for complete search history.

(56) References Cited

U.S. PATENT DOCUMENTS

| 6,200,858 | B1 * | 3/2001 | Kokubu ...................... 438/261 |
| 6,479,349 | B1 * | 11/2002 | Oya et al. ................... 438/261 |
| 2002/0142546 | A1 * | 10/2002 | Kouznetsov et al. ........ 438/257 |
| 2003/0068437 | A1 * | 4/2003 | Nakamura et al. ..... 427/255.27 |
| 2004/0119124 | A1 | 6/2004 | Omi et al. |
| 2004/0185647 | A1 * | 9/2004 | Dong et al. ................... 438/585 |
| 2005/0045941 | A1 | 3/2005 | Kurita et al. |
| 2006/0033143 | A1 * | 2/2006 | Chen et al. ................... 257/315 |
| 2006/0138538 | A1 * | 6/2006 | Ohmi et al. .................. 257/341 |
| 2006/0183296 | A1 * | 8/2006 | Yoo et al. .................... 438/424 |
| 2007/0167030 | A1 * | 7/2007 | Jee et al. ...................... 438/769 |

FOREIGN PATENT DOCUMENTS

| JP | 06349821 | * 12/1994 |
| JP | 11-40681 | 2/1999 |

OTHER PUBLICATIONS

Chinese Office Action dated Feb. 29, 2008, with English translation.

* cited by examiner

*Primary Examiner*—Marcos D. Pizarro
*Assistant Examiner*—Eva Yan Montalvo
(74) *Attorney, Agent, or Firm*—McGinn IP Law Group, PLLC

(57) ABSTRACT

An interpoly insulating film is modified in the film quality, while preventing generation of trap sites. A floating gate 101 is provided on a channel-forming region in the vicinity of the surface of a silicon substrate 112, an interpoly insulating film 134 is provided so as to contact with the floating gate 101, and a control gate 103 is provided so as to contact with the interpoly insulating film 134 and so as to be opposed to at least a part of the floating gate 101. A process step of providing the interpoly insulating film 134 further includes a step of forming on the floating gate 101, the interpoly insulating film 134 so as to contact with the floating gate 101, and a step of exposing, subsequently to the formation of the interpoly insulating film 134, the interpoly insulating film 134 to an atmosphere containing a nitrogen-containing gas and oxygen, to thereby simultaneously proceed nitriding and oxidation of the interpoly insulating film 134.

20 Claims, 11 Drawing Sheets

114  101    151  149

14  101  154  149  153

METHOD OF FABRICATING A NON-VOLATILE MEMORY ELEMENT INCLUDING NITRIDING AND OXIDATION OF AN INSULATING FILM

This application is based on Japanese patent application No. 2005-064628 the content of which is incorporated hereinto by reference.

BACKGROUND

1. Technical Field

The present invention relates to a technique of modifying quality of an insulating film in a non-volatile memory element.

2. Related Art

In a non-volatile memory element configured as having a floating gate and a control gate disposed while placing an interpoly insulating film in between, data writing is accomplished when hot electrons generated in a channel region on a substrate are incorporated into the floating gate. Data is erased when the electrons are drawn out from the floating gate into the control gate based on the F-N (Fowler-Nordheim) tunneling phenomenon.

The non-volatile memory element having the interpoly insulating film between the floating gate and the control gate as described in the above has been known to suffer from a problem in that repetitive writing and erasure result in generation of electron traps or trap sites in the insulating film, and thereby degrades the durability. The insulating film is generally formed by the CVD process, and intrinsically contains a large amount of traps in the film. The film also has a nature of producing a large amount of traps by the repetitive writing and erasure.

Japanese Laid-Open Patent Publication No. H11-40681 discloses a technique by which a CVD oxide film is subjected to nitriding in an atmosphere containing NO or $N_2O$ so as to introduce therein nitrogen, to thereby improve the film quality. The above patent publication described that the modification of the film quality made it possible to improve the quality of the tunnel oxide film, to reduce ratio of electrons emitted from the floating gate and trapped by the trap sites in the tunnel oxide film during the erasure operation, to prevent the erasure efficiency from degrading, and to thereby succeed in obtaining a long-life, non-volatile memory element.

SUMMARY OF THE INVENTION

Japanese Laid-Open Patent Publication No. H11-40681 described in the above prevents disturbance during writing and reading to or from an arbitrary target cell. FIG. 9 is a plan view schematically showing a target cell for writing, and non-selected cells adjacent to such target cell for writing. The present inventors, however, found out from their examination that the non-volatile memory element described in the above patent publication is not fully satisfactory in view of preventing the disturbance in non-selected word lines and bit lines. FIG. 10. is a diagram showing disturbance characteristics of the non-selected non-volatile memory element. FIG. 10 shows cumulative frequencies of amount of variation in the ON current (Ion) of the non-selected cells adjacent to the target cell for writing shown in FIG. 9. In FIG. 10, the dotted line indicates upper bound of standard range of the amount of variation in Ion. The plots indicated by filled circles (●) in FIG. 10 correspond to the characteristics related to the memory element fabricated by the method described in the above patent publication. It is found from FIG. 10 that as much as 85 to 90% of chips of the non-volatile memory element fabricated by the conventional process steps do not satisfy the standard amount of variation in Ion.

The present inventors then made extensive investigations into causes for the poor disturbance characteristics of the conventional non-volatile memory element. It was finally found that the technique described in the above patent document was insufficient in terms of effect of modifying the film quality. More specifically, the method described in the above patent publication allowed only nitriding reaction to proceed in modification of the film quality, but could not allow oxidation to proceed at the same time. Such incapability of proceeding oxidation in particular at the interface, therefore, has resulted in only a poor level of improvement in the interface characteristics between the floating gate and the interpoly insulating film.

FIG. 8A and FIG. 8B are sectional views explaining a configuration obtained by the method described in the above Japanese Laid-Open Patent Publication No. H11-40681. In the configuration shown in FIG. 8A and FIG. 8B, a diffusion layer (not shown) is provided at a predetermined position of a silicon substrate (not shown), and on the diffusion layer (not shown), a coupling oxide film (silicon oxide film 214) and a floating gate 201 are stacked in this order to form a predetermined geometry. FIG. 8A shows a state in which a CVD oxide film 249 was grown over the entire surface of the silicon substrate (not shown). In this state, the floating gate 201 composed of polysilicon, however, had a large surface roughness, and this has made it difficult to ensure a fully satisfactory level of adhesiveness at the interface 251 between the silicon substrate (not shown) and the CVD oxide film 249. FIG. 8B shows a post-NO-treatment state of the CVD oxide film 249, shown in FIG. 8A, after the NO treatment. Investigations by the present inventors into the configuration shown in FIG. 8B revealed that the surface roughness of the CVD oxide film 249 could not fully be eliminated even after the nitriding, as described later in Experiments referring to FIG. 11, remaining room for improving the adhesiveness at the interface 251.

Another possible method might be oxidation in succession to the nitriding, but the present inventors found out from their examinations that, as described later in Experiments, also this method still remained in further improvement in the characteristic failures.

Considering the above situation, the present inventors made further investigations to improve the disturbance characteristics of a non-volatile memory element and finally reach the present invention.

According to the present invention, there is provided a method of fabricating a non-volatile memory element which includes:

providing a floating gate on a channel-forming region in the vicinity of the surface of a semiconductor substrate;

providing an insulating film in contact with the floating gate; and providing a control gate so as to contact with the insulating film and so as to be opposed to at least a part of the floating gate, wherein the providing an insulating film further comprises:

forming the insulating film on the semiconductor substrate; and exposing, subsequently to the forming an insulating film, the insulating film to an atmosphere containing a nitrogen-containing gas and oxygen, to thereby simultaneously proceed nitriding and oxidation of the insulating film.

According to the present invention, the process step of providing an insulating film further includes a process step of exposing the insulating film to an atmosphere containing a nitrogen-containing gas and oxygen, to thereby simultaneously proceed nitriding and oxidation of the insulating film. The simultaneous nitriding an oxidation of the insulating film, after the formation thereof, makes it possible to introduce nitrogen into the insulating film, to decrease population of the trap sites in the insulating film, to smoothen the surface of the insulating film by oxidizing and thereby thickening it from the surface, and to terminate the dangling bonds in the insulating film to thereby improve the film quality. According to the fabrication method of the present invention, it is made possible to improve the film quality of the insulating film in contact with both of the floating gate and the control gate, and to decrease the population of the trap sites by raising the nitrogen content of the film. This consequently suppresses degradation of characteristics of the non-volatile memory element, and improves the durability.

It is to be noted that the insulating film in the present invention may be provided between the floating gate and the control gate.

According to the present invention, it is made possible to prevent the trap sites from generating in the insulating film and to improve the film quality, by forming the insulating film in contact with the floating gate, and then by exposing the insulating film to an atmosphere containing a nitrogen-containing gas and oxygen, to thereby simultaneously proceed nitriding and oxidation of the insulating film.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
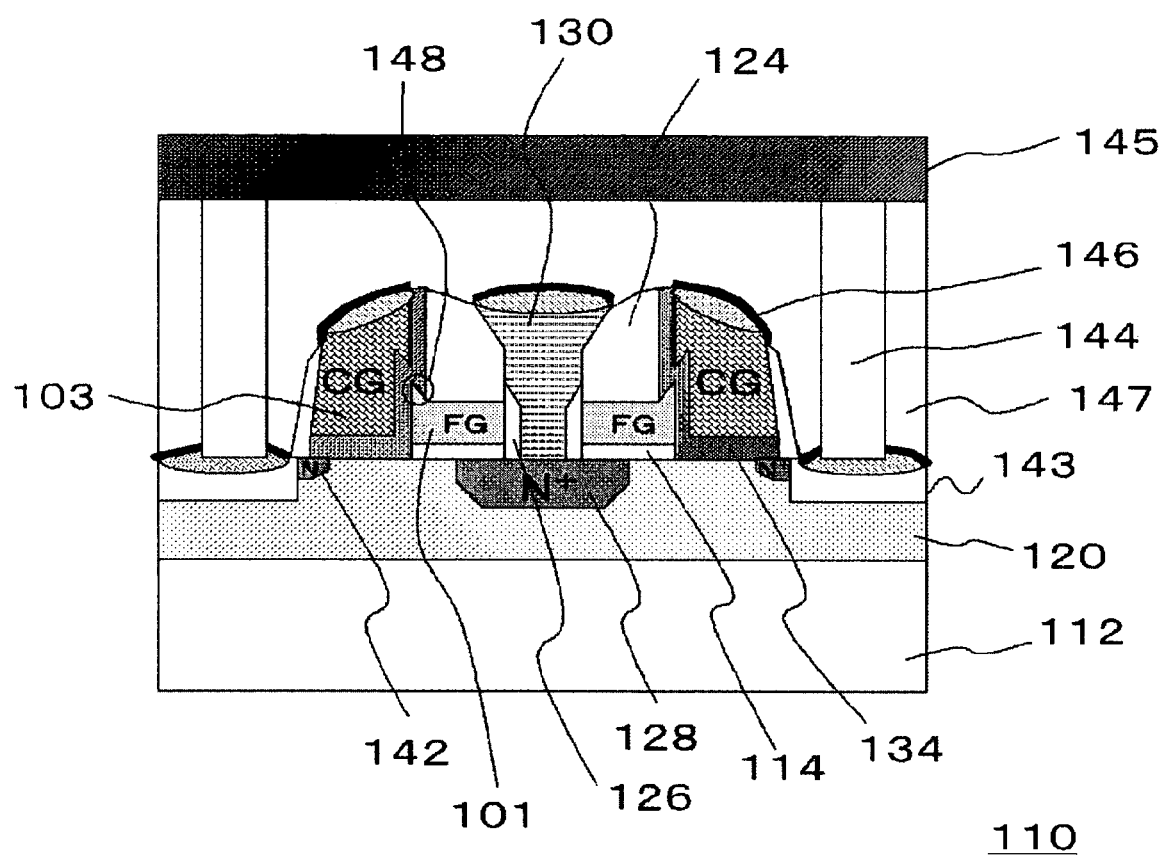
FIG. 1 is a sectional view showing a configuration of a non-volatile memory element in one embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Paragraphs below will explain embodiments of the present invention referring to the attached drawings. It is to be noted that any similar constituents will be given with the same reference numerals in all drawings and a common description will not be repeated in the following description, appropriately.

The present invention relates to a non-volatile memory element having a control gate and a floating gate on a channel region, while placing an interpoly insulating film in between. The explanation will begin with a configuration and a method of fabricating a non-volatile memory element, referring to the case of an SST (silicon storage technology)-type flash cell.

FIG. 1 is a sectional view showing a configuration of a non-volatile memory element 110 according to this embodiment. The non-volatile memory element 110 shown in FIG. 1 has a silicon substrate 112 having a P-well 120 formed in the surficial portion thereof, a floating gate (FG) 101 provided on the P-well 120, a control gate (CG) 103 provided on the P-well 120, and an interpoly insulating film 134, or an insulating film provided between polysilicon layers which are the floating gate 101 and the control gate 103.

The P-well 120 functions as a channel region of the non-volatile memory element 110. Each of the floating gate 101 and the control gate 103 are composed of a polysilicon film. The silicon substrate 112 and the floating gate 101 are isolated by a silicon oxide film 114 which functions as a gate insulating film. The control gate 103 is brought into contact with the interpoly insulating film 134, and is opposed to the floating gate 101 while placing the interpoly insulating film 134 in between. The floating gate 101 is provided with an edge portion 148, and the control gate 103 is provided with a concave at a position opposing to the edge portion 148, with a geometry corresponded to the projection of the edge portion 148.

The interpoly insulating film 134 is configured as having a oxynitrided layer as a result of introduction of nitrogen into the CVD oxide film, and as having an oxide film thickened in the vicinity of the interface with the floating gate 101, although not shown.

In the region having the P-well 120 formed therein, a source region 128 and a drain region 142 are formed in predetermined regions in the surficial portion of the silicon substrate 112. On the silicon substrate 112, a source polysilicon film 130 is formed so as to contact with the source region 128. The floating gate 101 and the source polysilicon film 130 are isolated by a first HTO film 124 and a second HTO film 126. A drain electrode 143 is provided so as to contact with the drain region 142. The top portions of the drain electrode 143, the source polysilicon film 130, and the control gate 103 are respectively silicided, and thereby have a CoSix layer 146 formed thereon.

An insulating interlayer 147 is provided on the silicon substrate 112, and on the insulating interlayer 147, a bit line 145 is provided in contact with the insulating interlayer 147. The drain electrode 143 and the bit line 145 are connected by W plugs 144.

The following paragraphs will describe operation of thus-configured, non-volatile memory element 110.

(i) Erasure

When the source region 128 and the drain region 142 are applied with the ground potential, and the control gate 103 is applied with a predetermined positive potential (approximately 13 to 14 V), electrons in the floating gate 101 are excited by the F-N tunneling phenomenon, and migrate to the control gate 103. The steep edge portion 148 formed on the floating gate 101 contributes to concentrate the electric field, and to promote the tunneling effect to thereby improve the erasure efficiency. This makes the floating gate 101 have no electrons trapped therein.

(ii) Writing

When the drain region 142 is applied with a predetermined positive potential (approximately 1 to 2 V), electrons in the vicinity of the channel are activated (generation of hot electrons). The control gate 103 is then applied with a predetermined positive potential (approximately 0.1 V), and also the source region 128 is applied with a predetermined potential (approximately 7 to 9 V). This makes the electrons generated in the drain region 142 flow from the drain region 142 through the channel region to the source region 128. In this process, the hot electrons are incorporated into the floating gate 101.

(iii) Reading

The source region 128 is applied with the ground potential, and the drain region 142 is applied with a predetermined positive potential (approximately 0.5 V). Also the control gate 103 is applied with a predetermined positive potential (approximately 2 to 3 V). Presence or absence of electric current flowing between the drain region 142 and the source region 128 is read out as data.

Next paragraphs will describe a method of fabricating the non-volatile memory element 110 shown in FIG. 1. The method of fabricating the non-volatile memory element 110 includes the steps described below:

Step 101: forming a floating gate 101 on the channel-forming region in the surficial portion of the semiconductor substrate (silicon substrate 112);

Step 102: providing an insulating film (interpoly insulating film 134) in contact with the floating gate 101; and Step 103: providing a control gate 103 in contact with the interpoly insulating film 134, so as to be opposed to at least a part of the floating gate 101.

Step 102 for providing the interpoly insulating film 134 further includes:

Step 201: forming the interpoly insulating film 134 on the floating gate 101; and Step 202: exposing, subsequently to the forming the interpoly insulating film 134 (Step 201), the interpoly insulating film 134 to an atmosphere containing a nitrogen-containing gas and oxygen, to thereby simultaneously proceed nitriding and oxidation of the interpoly insulating film 134.

Step 201 for forming the interpoly insulating film 134 includes forming an HTO film by the reduced-pressure CVD process. All processes from Step 201 to Step 202 can be carried out in a single reduced-pressure CVD apparatus (reduced-pressure CVD furnace). This makes it possible to further simplify the process of providing the interpoly insulating film 134 (Step 102).

Step 202 for exposing the interpoly insulating film 134 to the atmosphere containing the nitrogen-containing gas and oxygen to thereby simultaneously proceed nitriding and oxidation of the interpoly insulating film 134 includes heating the interpoly insulating film 134 in an atmosphere containing NO and $O_2$. Alternatively, a process step of heating the interpoly insulating film 134 in an atmosphere containing $N_2O$ and $O_2$ is also allowable.

Step 202 for exposing the interpoly insulating film 134 to the atmosphere containing the nitrogen-containing gas and oxygen to thereby simultaneously proceed nitriding and oxidation of the interpoly insulating film 134 is a step of smoothing the surface of the interpoly insulating film 134 in a portion in contact with the floating gate 101.

Step 202 for exposing the interpoly insulating film 134 to the atmosphere containing the nitrogen-containing gas and oxygen to thereby simultaneously proceed nitriding and oxidation of the interpoly insulating film 134 includes allowing the interpoly insulating film 134 to grow in the thickness-wise direction thereof by oxidation of the interpoly insulating film 134. The allowing the interpoly insulating film 134 to grow in the thickness-wise direction thereof is typically a step of increasing the thickness of the interpoly insulating film 134 by 0.3 nm or more and 3 nm or less.

Paragraphs below will further detail a method of fabricating the non-volatile memory element 110 referring to FIGS. 2A to 2C, FIGS. 3A and 3B, FIGS. 4A to 4C, and FIGS. 5A and 5B. FIGS. 2A to 2C, FIGS. 3A and 3B, FIGS. 4A to 4C, and FIGS. 5A and 5B are sectional views showing process steps of fabricating the non-volatile memory element according to an embodiment of the present invention.

Figure 2A:
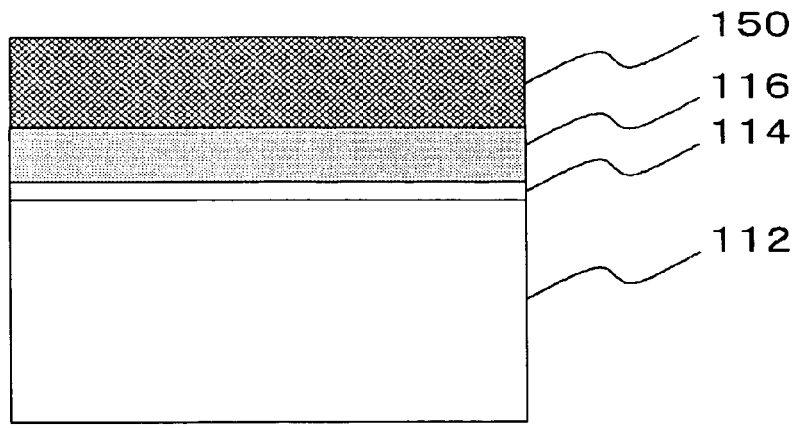
FIGS. 2A to 2C are sectional views showing process steps of fabricating the non-volatile memory element shown in FIG. 1.

First, on the silicon substrate 112, the silicon oxide film 114, an FG (floating gate) polysilicon film 116, and a silicon nitride film 150 are formed in this order. The FG polysilicon film 116 is processed later to give the floating gate 101. Next, the silicon nitride film 150 and the FG polysilicon film 116 are partially removed by known lithographic and etching techniques, to thereby form trenches (not shown), and STI regions (not shown) isolating elements are formed using the silicon nitride film 150 as a mask (FIG. 2A).

Figure 2B:
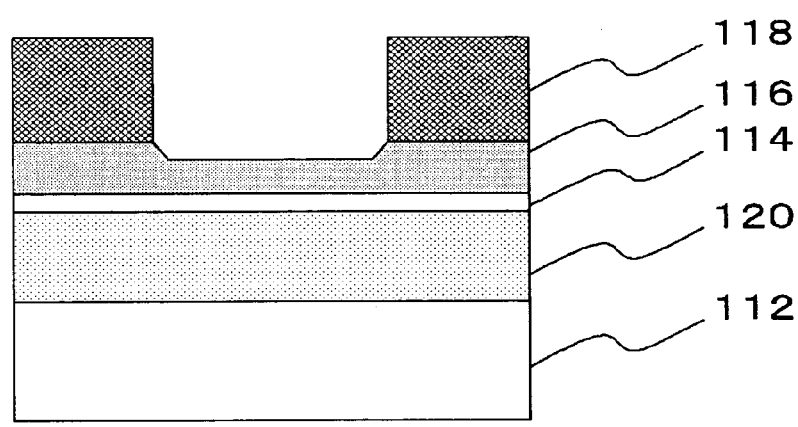

The silicon nitride film 150 is then removed, and the FG polysilicon film 116 is implanted with As ions to thereby form the P-well 120. Another silicon nitride film 118 is then formed on the silicon substrate 112, and is patterned to give a predetermined geometry. Using known lithographic and etching techniques, and by using the silicon nitride film 118 as a mask, the FG polysilicon film 116 is partially removed. In this process, the interfacial portion of the etched region of the FG polysilicon film 116 will have a sloped geometry having rounded edges (FIG. 2B). This makes it possible, in the later process, to form the edge portion 148 (FIG. 1) having the geometry corresponded to the sloped geometry, and to thereby improve the erasure efficiency.

Figure 2C:
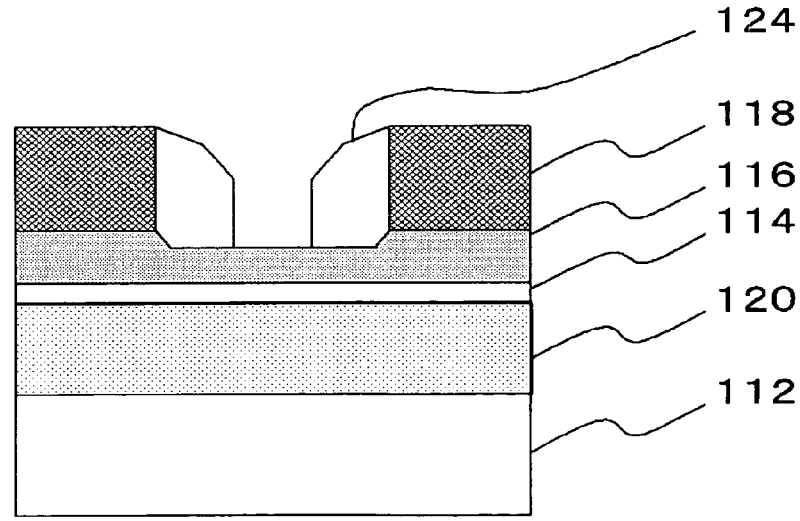
Figure 3A:
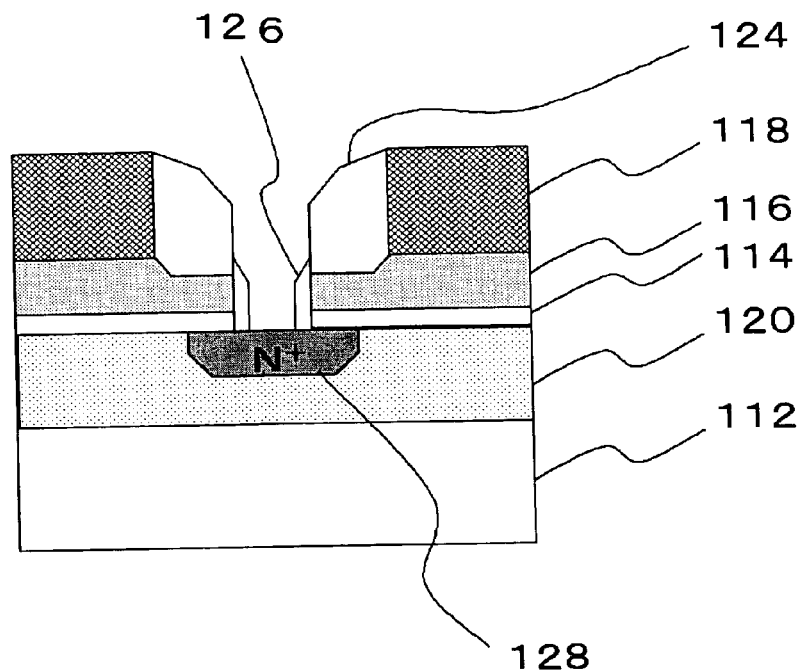
FIGS. 3A and 3B are sectional views showing process steps of fabricating the non-volatile memory element shown in FIG. 1.

Next, the first HTO film 124 is grown so as to fill the region from which the silicon nitride film 118 and the FG polysilicon film 116 have been removed, and is then etched back so as to allow the FG polysilicon film 116 to partially expose (FIG. 2C). The exposed FG polysilicon film 116 and the underlying silicon oxide film 114 are then removed, and a second HTO film 126 is grown so as to fill the region from which the silicon oxide film 114 has been removed, and the second HTO film 126 is then etched back to thereby allow the surface of the P-well 120 to partially expose. Arsenic and phosphorus are then sequentially implanted to thereby form an $N^+$-type source region 128 (FIG. 3A).

Figure 3B:
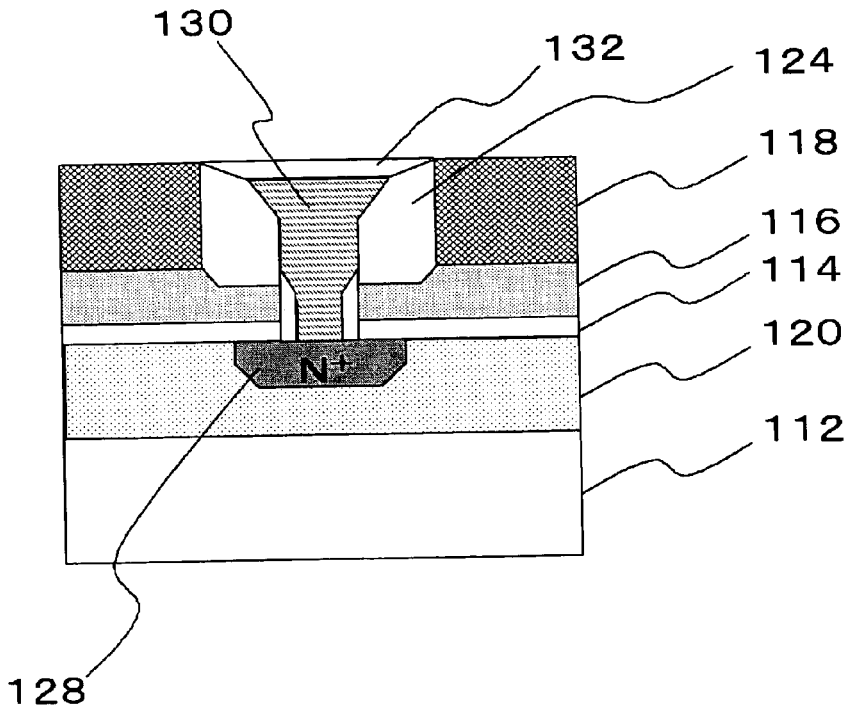

The source polysilicon film 130 is then grown on the source region 128, etched back to remove unnecessary portion, and the surface of the source polysilicon film 130 is oxidized to thereby form a protective oxide film 132 (FIG. 3B).

Next, using the protective oxide film 132 as a mask, the silicon nitride film 118, the FG polysilicon film 116 and the silicon oxide film 114 are partially removed by any known etching technique. The floating gate 101 is thus formed (Step 101). The interpoly insulating film 134 is then grown (Step

Figure 4A:
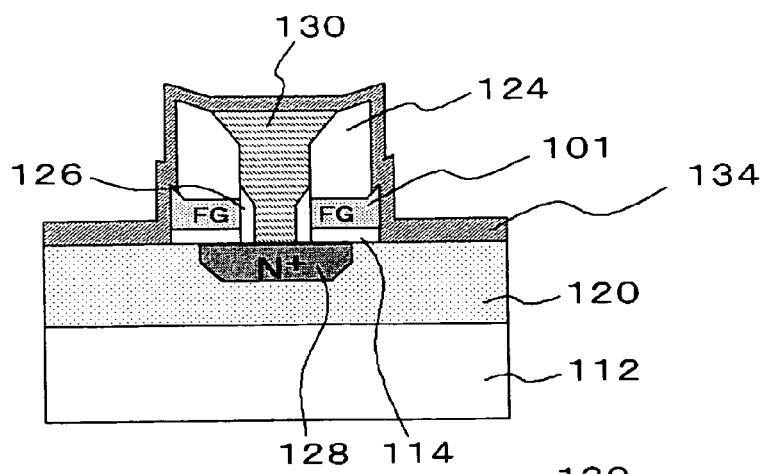
FIGS. 4A to 4C are sectional views showing process steps of fabricating the non-volatile memory element shown in FIG. 1.

102, FIG. 4A). A method of growing the interpoly insulating film 134 will be described later.

Figure 4B:
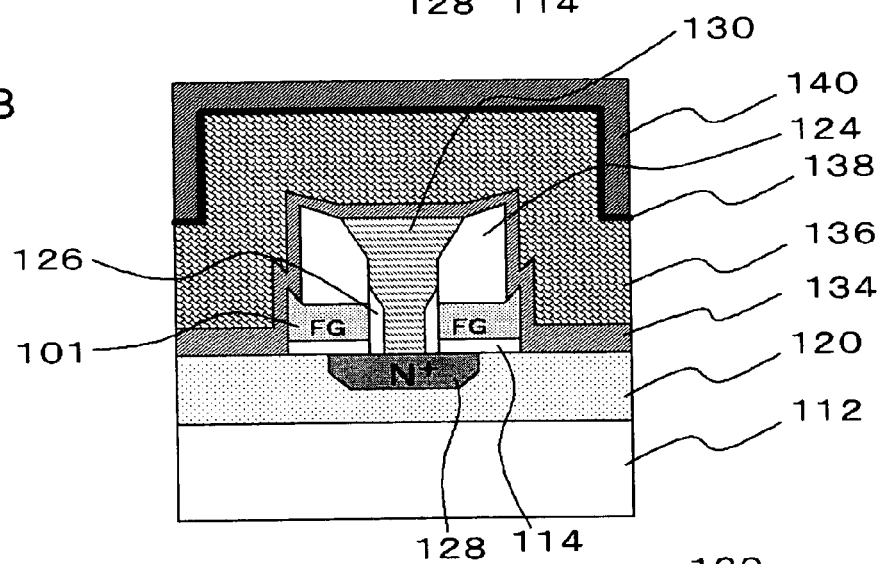

A CG polysilicon film 136 is then grown, processed to give a predetermined geometry, and a silicon nitride film 138 and a gate polysilicon film 140 are formed on the CG polysilicon film 136 (FIG. 4B). The CG polysilicon film 136 is processed later to give the control gate 103.

Figure 4C:
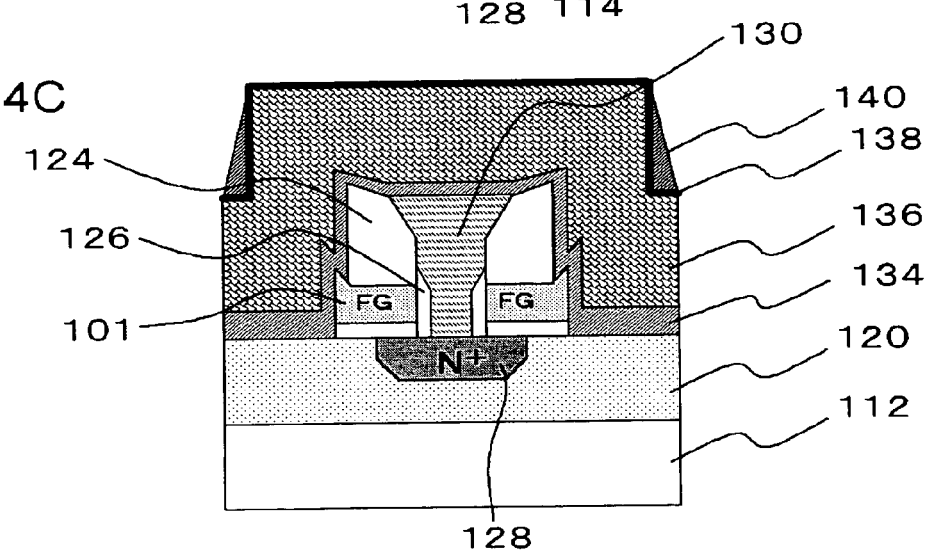
Figure 5A:
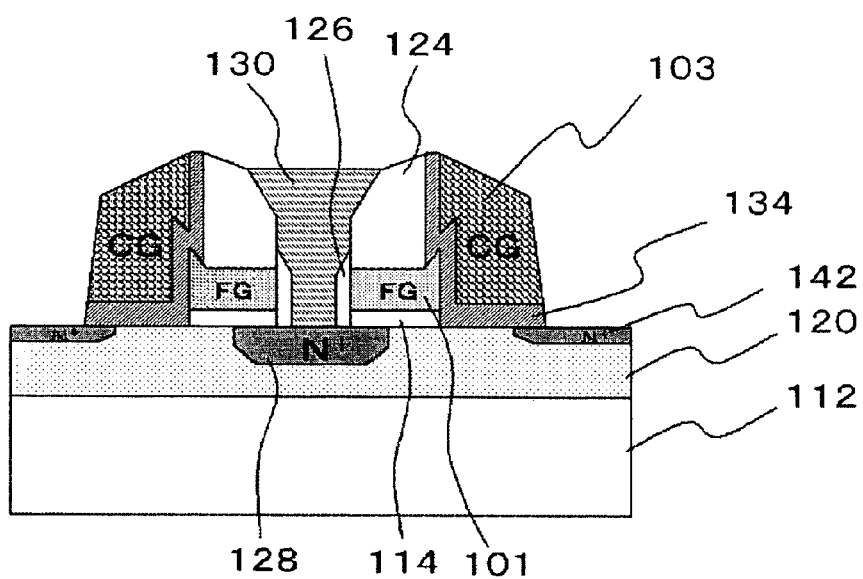
FIGS. 5A and 5B are sectional views showing process steps of fabricating the non-volatile memory element shown in FIG. 1.

The gate polysilicon film 140 is then processed by any known lithographic and etching techniques to give a predetermined geometry in the transistor-forming region (FIG. 4C). In the non-volatile memory element forming region, unnecessary portions of the polysilicon film 140 and the silicon nitride film 138 are then etched off. Next, in the non-volatile memory element forming region, the CG polysilicon film 136 is etched back to form the control gate 103 (Step 103). Unnecessary portion of the interpoly insulating film 134 is then removed, and arsenic is then implanted into the P-well 120 in the silicon substrate 112, to thereby form the $N^+$-type drain region 142 (FIG. 5A).

Figure 5B:
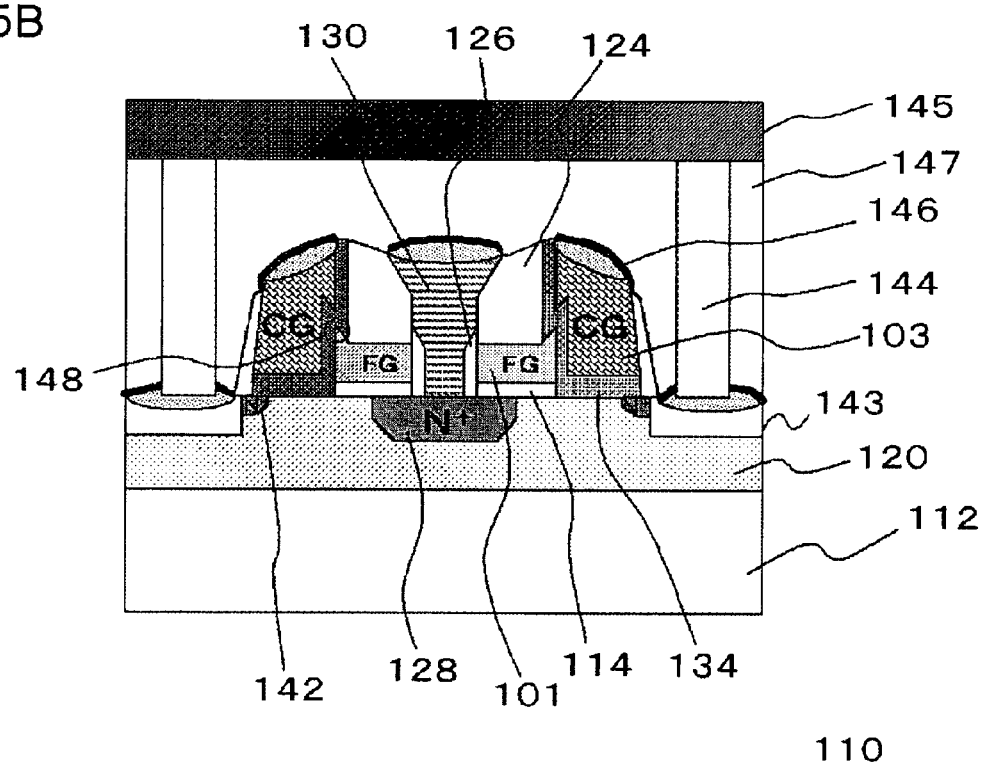

Next, the drain electrode 143, the CoSix (cobalt silicide) layer 146 are formed, and the insulating interlayer 147, the W plugs 144 and bit line 145 are further formed to thereby complete the non-volatile memory element 110 (FIG. 5B).

Out of all process steps of fabricating the non-volatile memory element 110, next paragraphs will further detail Step 102 for providing the interpoly insulating film 134. In the embodiment described below, the process step of providing the interpoly insulating film 134 includes a step of forming the HTO film (Step 201) and an annealing step of the HTO film (Step 202).

First Embodiment

As has been described in the above, the interpoly insulating film 134 is formed after the floating gate 101 is processed. In this embodiment, the interpoly insulating film 134 is formed by exposing, after formation of the HTO film (Step 201), the HTO film simultaneously to a nitrogen-containing gas and oxygen, to thereby introduce nitrogen into the HTO film and thicken it (Step 202).

The interpoly insulating film 134 is formed by the CVD process. More specifically, a Si-containing gas and an oxygen-containing gas are used as film-forming gases in an LP furnace (reduced-pressure CVD furnace), and the HTO (high temperature oxide) film is grown under a reduced pressure of 150 Pa or lower, and at a temperature of 750° C. or above, and more preferably approximately 800° C. to 850° C. The thickness of the HTO film may be of any desired value, typically in the range from 8 nm to 20 nm, both ends inclusive. $SiH_4$ or $SiHCl_2$ is typically used as the Si-containing gas. $N_2O$ is typically used as the oxygen-containing gas.

Next, for the purpose of modifying the film, the HTO film is introduced with nitrogen using NO gas, and at the same time the interface on the floating gate 101 side thereof is modified using oxygen gas. More specifically, using a resistance-heating-type batch type diffusion furnace, the HTO film is annealed under setting of the annealing temperature of typically at 750° C. to 880° C., in an atmosphere containing NO together with oxygen ($O_2$), to thereby simultaneously proceed nitriding and oxidation of the HTO film. As a specific annealing condition allowing the nitriding and oxidation to proceed at the same time, a ratio of flow rate of $O_2$ gas to NO gas is typically adjusted in the range from 0.2 times to 10 times, both ends inclusive. The amount of thickening of the HTO film by the oxidation in this process will fall in the range typically from 0.3 nm to 3 nm, both ends inclusive. Adjusting the amount of thickening to as much as 0.3 nm or more makes it possible to further ensure the effect of oxidation, and to more sufficient modification. The upper limit of the amount of thickening is selected so as to maintain an appropriate geometry of the floating gate 101, wherein the amount of thickening adjusted to as much as 3 nm or less makes it possible to form the floating gate 101 more stably according to a predetermined geometry.

The annealing temperature in the modification of the HTO film, for the case of fabricating an SST-type flash cell, is necessarily selected in an temperature range not causative of adverse effects on the channel impurities or the source structure already formed, so that an appropriate range thereof, for the case where a general resistance-heating-type batch diffusion furnace is used, is as descried in the above, as a natural matter of course of selecting an appropriate thickening range. In view of keeping the geometry of the edge of the floating gate, appropriate ranges of flow rate of $O_2$ gas and the thickening by annealing are as described in the above.

There is no special limitation on the upper limit of pressure of the atmosphere in which the HTO film is annealed, and can typically be set to 700 Pa or more. This makes it possible to further exactly increase the thickness of the HTO film.

Effects of this embodiment will be described in the next.

In the fabrication of the non-volatile memory element 110, the HTO film is formed by the CVD process in the step of forming the interpoly insulating film 134 (Step 201), and is then annealed under the conditions allowing oxidation and nitriding of the HTO film to proceed at the same time (Step 202). Annealing of the oxide film obtained by the CVD process, proceeded under the conditions allowing the nitriding and oxidation to proceed at the same time using the nitriding gas and oxidizing gas, yields the effects below.

That is, it is made possible to increase nitrogen content in the vicinity of the interface with the floating gate 101, to decrease population of the trap sites in the interpoly insulating film 134, to thicken the film by allowing the oxide film to grow on the side facing to the interface with the floating gate 101, and to reduce the roughness of the interface with the floating gate 101 to thereby smoothen it. The bulk HTO film before being treated by the modification gas has Si dangling bonds, but contact with $O_2$ terminates the dangling bonds to thereby improve the film quality. It is therefore made possible in Step 202 to smoothen the interpoly insulating film 134, and to simultaneously proceed the film modification terminating the dangling bonds in the interpoly insulating film 134 and reduction in population of the trap sites. Such simultaneous treatments raise a synergistic effect that the non-volatile memory element 110 will have a configuration excellent in the interfacial adhesiveness between the floating gate 101 and the interpoly insulating film 134, and improved in the disturbance characteristics. The non-volatile memory element 110 is thus configured as being well suppressed in degradation in the characteristics of cell transistors, and as being excellent in the durability.

Next paragraphs will further explain the effects of annealing of the HTO film under conditions allowing oxidation and nitriding of the HTO film to proceed at the same time, in comparison with the conventional procedures.

Figure 7A:
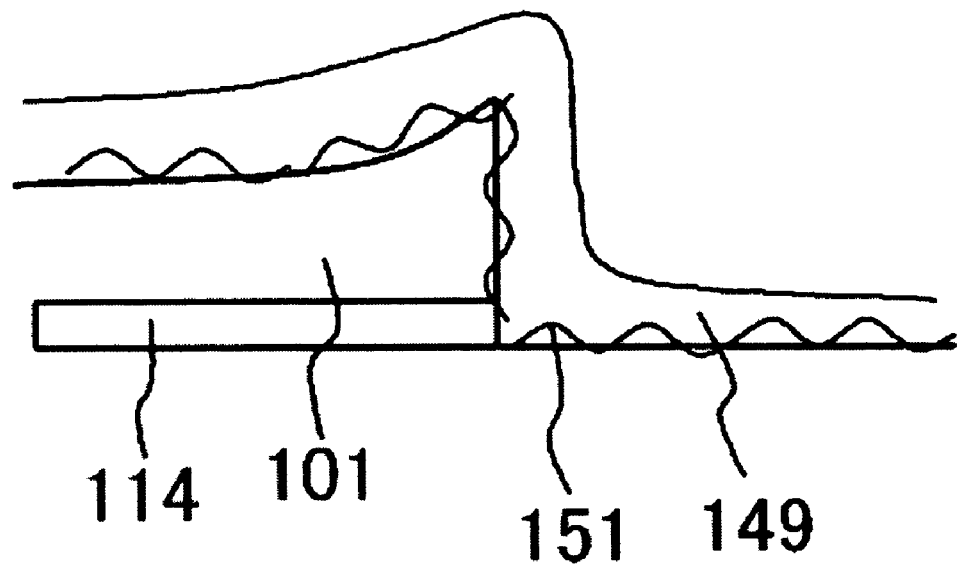
FIGS. 7A and 7B are drawings explaining structures of the interpoly insulating film according to an embodiment of the present invention.
Figure 7B:
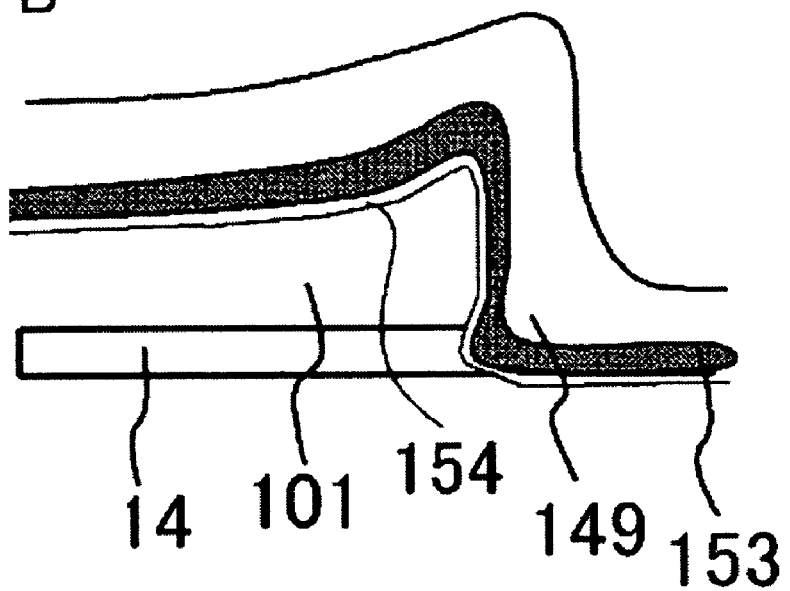

FIG. 7A and FIG. 7B are sectional views showing process steps of fabricating the interpoly insulating film 134 of this embodiment. As shown in FIG. 7A, the coupling oxide film (silicon oxide film 114) and the floating gate 101 are formed on the silicon substrate 112 (not shown). Thereafter, on the floating gate 101 and the silicon substrate 112, a CVD oxide film 149 is formed as the HTO film. The surface of the CVD oxide film 149 herein at the interface 151 with the floating gate 101 and with the silicon substrate 112 is rough, and has the dangling bonds remained therein.

This embodiment therefore adopts the simultaneous NO treatment and $O_2$ treatment. This allows, as shown in FIG. 7B, to nitrogen to be introduced into the CVD oxide film 149 to thereby form an oxynitrided film layer 153 in the vicinity of the interface with the floating gate 101 and with the silicon substrate 112. Concentration of nitrogen therein is preferably 1 at % to 3 at %, both ends inclusive. Because of the introduction of $O_2$, an oxide film layer 154 is formed at the interface with the floating gate 101 and with the silicon substrate 112. This makes it possible to reduce the trap sites and to improve the adhesiveness at the interface, and a synergistic effect of these events can distinctively improve the disturb characteristics of the non-volatile memory element 110.

Figure 8A:
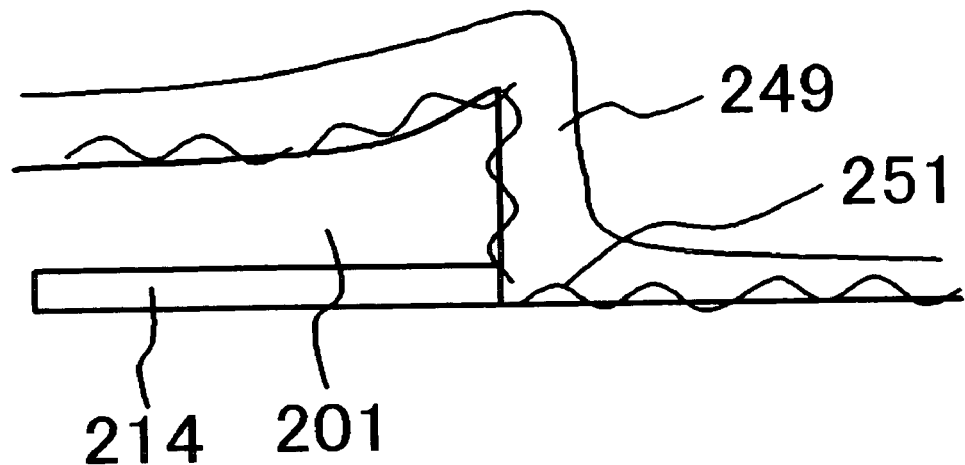
FIGS. 8A and 8B are drawings explaining structures of the interpoly insulating film.
Figure 8B:
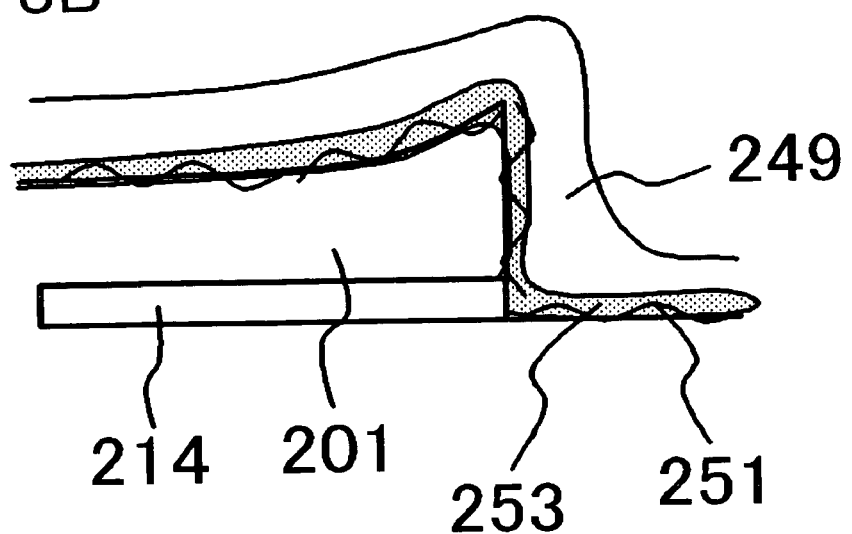

On the other hand, FIG. 8A and FIG. 8B are sectional views showing the conventional process steps of fabrication as described above in the summary of the invention. As shown in FIG. 8A, the coupling oxide film (silicon oxide film 214) and the floating gate 201 are formed on the silicon substrate (not shown). Thereafter, on the floating gate 201 and the silicon substrate, the CVD oxide film 249 is formed. The surface of the CVD oxide film 249 herein at the interface 251 with the floating gate 201 and with the silicon substrate is rough, and has the dangling bonds remained therein.

In FIG. 8B, the CVD oxide film 249 is subjected only to the NO treatment. This allows nitrogen to be introduced into the CVD oxide film 249 on the side facing to the interface with the floating gate 201 and with the silicon substrate, to thereby form a nitrided layer 253. The surface roughness of the interface 251 in this case is, however, not fully smoothened even after formation of the nitrided layer 253, and has raised an anticipation of insufficient improvement in the interface characteristics. In addition, another anticipation has resided in the SST-type, non-volatile memory element, in that the carrier mobility would be lowered due to nitriding of the interface of the oxide film used for cell transistors, and thereby the performance would be degraded.

The present inventors also examined a fabrication method adopting, in the process shown in FIG. 8B, the $O_2$ treatment only in place of the NO treatment, only to find that the trap sites could not be reduced because the nitrided layer was not formed, and that the disturbance characteristics again could not fully be improved.

The present inventors further examined a fabrication method adopting, in succession to the process shown in FIG. 8B, the $O_2$ treatment as an additionally process, only to find again that the surface roughness of the interface 251, causative of poor characteristics, could not fully be smoothened.

In contrast to these, as has been described in the above referring to FIG. 7A and FIG. 7B, the present embodiment carries out the NO treatment and the $O_2$ treatment at the same time, and a synergistic effect of which makes it possible to exhibit a distinctive effect of improving the disturbance characteristics, beyond the level independently achievable by the nitriding and the oxidation.

In the non-volatile memory element 110, the floating gate 101 having the steep edge portion 148 formed thereon will concentrate electric field in this portion. In view of improving the erasure efficiency of the non-volatile memory element 110, it is therefore necessary to suppress generation of the trap sites at the interface between the interpoly insulating film 134 and the edge portion 148 of the floating gate 101. The interpoly insulating film 134 in this embodiment contains nitrogen introduced therein during the modification of the HTO film, and thus can suppress generation of the trap sites by virtue of an increased nitrogen concentration. This makes it possible to suppress characteristic degradation of the non-volatile memory element 110 during repetitive writing and erasure.

This embodiment also allows nitriding and oxidation of the HTO film to simultaneously proceed in the process of forming the interpoly insulating film 134 of the SST-type, non-volatile memory element, to thereby introduce nitrogen into the oxide film while thickening the film. This makes it possible to introduce nitrogen for reducing the traps at the position somewhat distant from the interface with the floating gate 101, and consequently to suppress degradation in the carrier mobility. It is therefore made possible to improve the characteristic degradation of the oxide film used for cell transistors.

It is to be noted that Step 202 in this embodiment was explained referring to the case where the HTO film is annealed in an atmosphere containing $O_2$ and NO, whereas the annealing of the HTO film may be carried out, in this embodiment and any other embodiments described later, in an atmosphere containing $O_2$ and a nitrogen-containing gas, and it is also allowable to use $N_2O$, $NH_3$ or $N_2$, in place of NO, as the nitrogen-containing gas. As the nitrogen-containing gas, it is preferable to use a gas containing no elements other than nitrogen and oxygen, such as NO, $N_2O$ or $N_2$. This makes it possible to prevent any other elements from being introduced into the HTO film. For example, use of $N_2O$ gas allows the same treatment with the case where NO was used as described in the above, and results in similar effects.

The embodiments below will be explained emphasizing aspects which differ from those in the first embodiment.

Second Embodiment

Of the process steps of fabricating the non-volatile memory element 110 shown in FIG. 1, the annealing for modifying the HTO film which serves as the interpoly insulating film 134 may be carried out in an atmosphere further containing $N_2$ gas, in addition to NO or $N_2O$ gas in combination with $O_2$ gas.

In this embodiment, $N_2$ is added for dilution in order to adjust the rate of oxidation. This makes it possible to suppress the amount of increase in the thickness of the HTO film, while keeping the modification effect by the annealing. This is because the $N_2$ dilution does not largely alter the amount of introduction of nitrogen ascribable to NO gas, but the oxidation is suppressed by the dilution. According to the method of modification in this embodiment, it is therefore made possible to independently and arbitrarily control the amount of thickening of the HTO film due to oxidation. The roughness of the interface of the interpoly insulating film 134 can therefore be decreased, and the thickness of the insulating film 134 can be controlled more exactly to a desired thickness.

Third Embodiment

Figure 6:
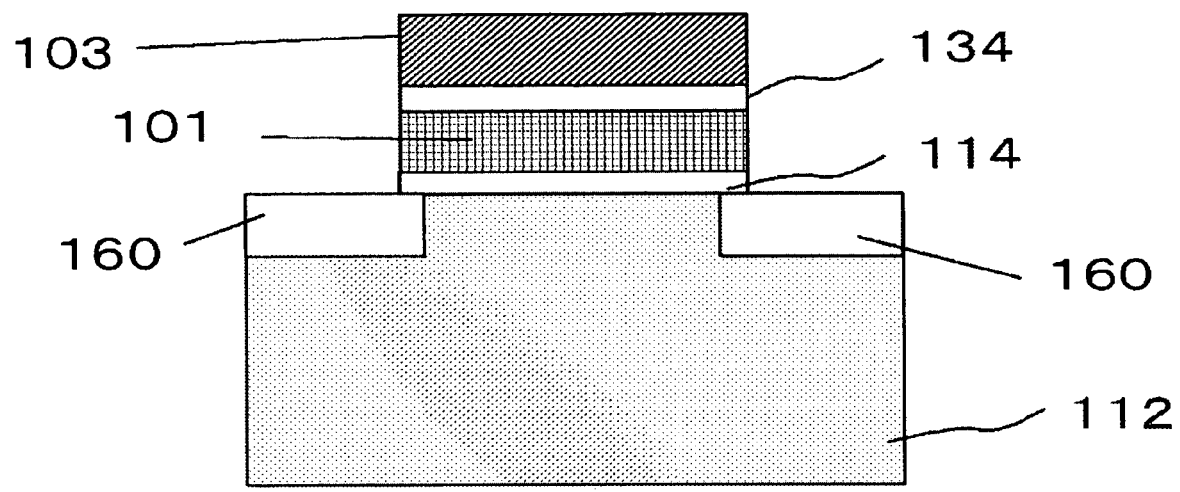
FIG. 6 is a sectional view showing a configuration of the non-volatile memory element according to an embodiment of the present invention.

FIG. 6 is a drawing showing another embodiment of the non-volatile memory element 110. In FIG. 6, the floating gate FG 101 is provided on the silicon substrate 112 while placing the silicon oxide film 114 in between, and a source/drain region 160 is provided adjacent to the floating gate FG 101. On the floating gate FG 101, the control gate CG 103 is provided while placing the interpoly insulating film 134 in between.

The methods of growing the interpoly insulating film 134 explained in the first embodiment and the second embodiment are adoptable also to formation of the interpoly insulating film 134 in the non-volatile memory element 110 having the control gate CG 103 formed on the floating gate FG 101 as shown in FIG. 6.

The present invention has been described in the above referring to the embodiments, wherein the embodiments are merely of exemplary purposes, so that it will be readily understood by those skilled in the art that various modifications are allowable and within the scope of the present invention.

For example, the above embodiments dealt with the case where the batch type diffusion furnace was used for the annealing of the HTO film in the process of forming the interpoly insulating film 134, whereas the annealing of the HTO film is not limited to the process of using such batch type diffusion furnace, and use of a single-wafer apparatus, such as RTP apparatus for example, can achieve similar treatment and effects.

The above description dealt with the case where the modification was adopted to the interpoly insulating film 134 formed between the control gate 103 and the floating gate 101, whereas it is also adoptable to the silicon oxide film 114 formed on the silicon substrate 112.

The above description dealt with the configuration of the SST-type, non-volatile semiconductor memory element, wherein the configuration of the non-volatile semiconductor memory element is not limited to the SST-type allowing other types such as NAND type, AND type, NOR type and split gate type.

EXAMPLES

Experiment 1
The non-volatile memory element 110 shown in FIG. 1 was fabricated using the method described in the first embodiment.

Experiment 2
In the process steps of fabricating the non-volatile memory element 110 shown in FIG. 1, the atmosphere used for modifying the HTO film was altered from that used in Experiment 1, so as to contain only NO, but no $O_2$, and thereby the non-volatile memory element was fabricated.

Experiment 3
In the process steps of fabricating the non-volatile memory element 110 shown in FIG. 1, the atmosphere used for modifying the HTO film was altered from that used in Experiment 1, so as to contain only $O_2$, but no NO, and thereby the non-volatile memory element was fabricated.

Experiment 4
In the process steps of fabricating the non-volatile memory element 110 shown in FIG. 1, the atmosphere used for modifying the HTO film was altered from that used in Experiment 1 to a two-step process in which the annealing is carried out in an atmosphere containing only NO but no $O_2$, and is further carried out in an atmosphere containing only $O_2$ but no NO, and thereby the non-volatile memory element was fabricated.

Evaluation
Disturbance characteristics of non-selected cells in thus-obtained, non-volatile memory elements were evaluated. Surface roughness of the interpoly insulating film in the non-volatile memory element, on the side facing to the floating gate, was also measured.

Figure 9:
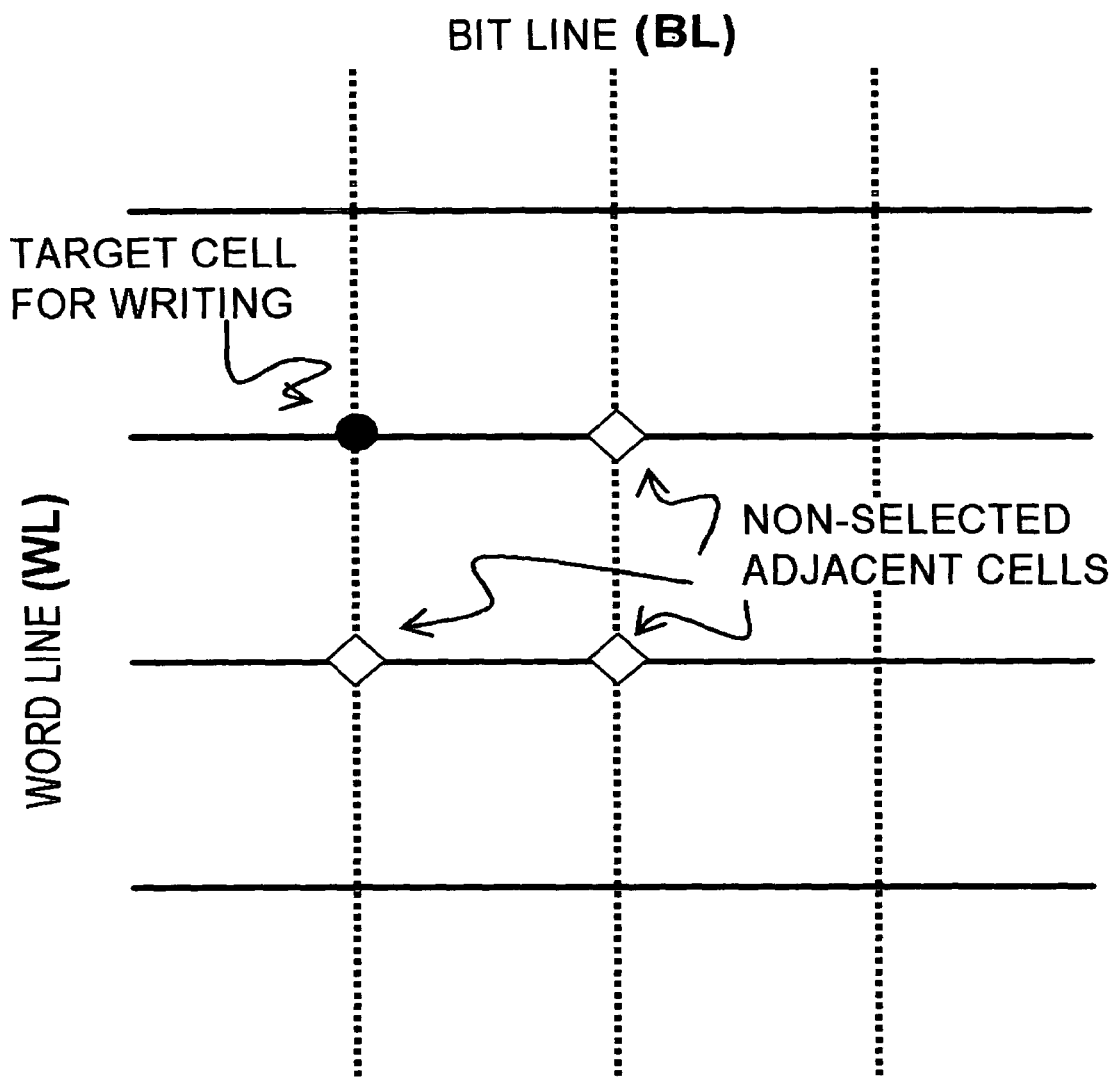
FIG. 9 is a drawing schematically showing a planar arrangement of a target cell for writing and non-selected cells adjacent to the target cell for writing in an Experiment.
Figure 10:
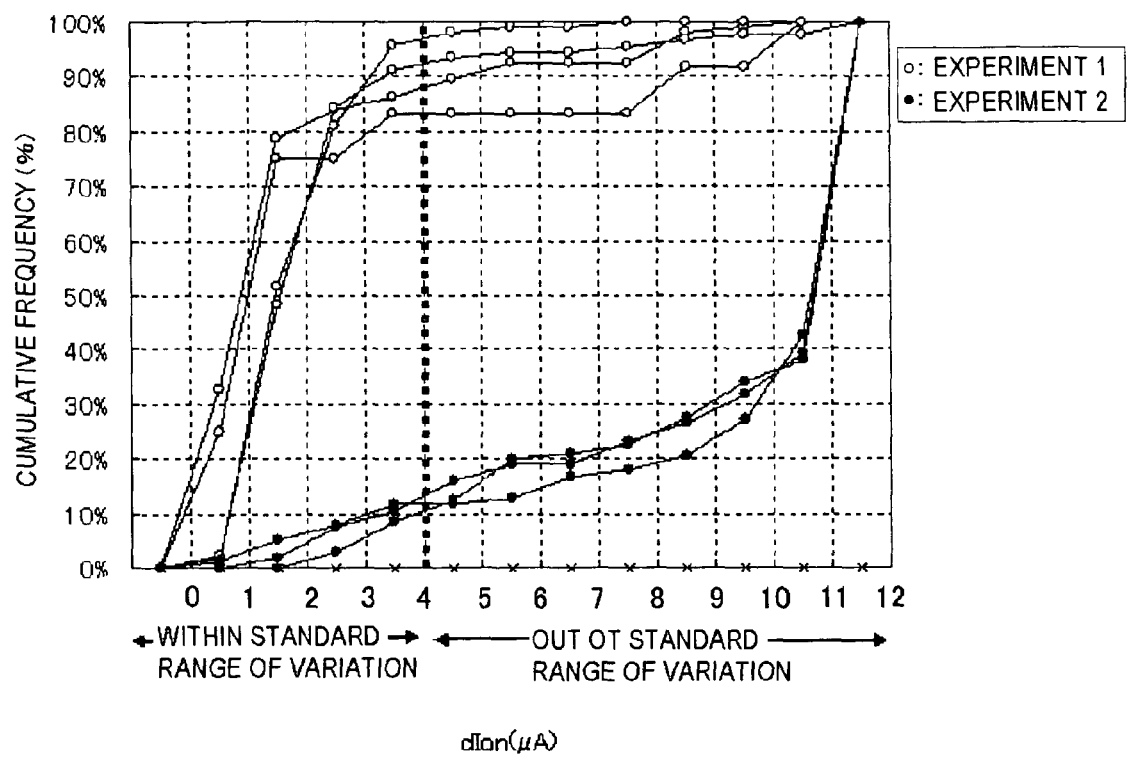
FIG. 10 is a drawing showing disturbance characteristics of the non-selected cells in the Experiments.

First, FIG. 10 is a drawing showing disturbance characteristics of the non-selected cells in the non-volatile memory element. The abscissa of FIG. 10 represents amount of variation (dIon, in μA) in ON current (Ion) in the non-selected cells (FIG. 9) adjacent to a target cell for writing, and the ordinate represents cumulative frequencies (%) of the cells having their respective dIon values. In FIG. 10, the dotted line indicates upper bound of standard range of the amount of variation in Ion. The blank plots (○) in FIG. 10 correspond to the characteristics of the non-volatile memory element fabricated in Experiment 1. Whereas as described in the Prior Art, the filled plots (●) in FIG. 10 correspond to the characteristics of the non-volatile memory element of Experiment 2.

It is found from FIG. 10 that the non-volatile memory element of Experiment 2 has only approximately 10 to 15% cells which satisfy the standard, whereas the non-volatile memory element 110 of Experiment 1 improves the value to as high as 80 to 95%. As is clear from the above, annealing of the interpoly insulating film under conditions allowing the nitriding and oxidation to proceed at the same time made it possible to prevent disturbance of the non-selected cells, and to improve the yield ratio by as much as five times or more.

Although not shown in FIG. 10, the non-volatile memory element 110 of Experiment 1 showed a distinctive improvement in the yield ratio over the non-volatile memory elements obtained in Experiment 3 and Experiment 4. It is inferred that, in the non-volatile memory element of Experiment 4, nitrogen was directly introduced into the interface between the floating gate 201 and the CVD oxide film 249 as shown in FIG. 8B to thereby form SiN bonds, so that oxygen diffusion in the succeeding oxidation was non-uniformly inhibited at the interface having the SiN bonds already formed therein, and this resulted in formation of an oxide film having a lot of oxygen-vacant lattice points, and consequently raised characteristic failure due to a lot of traps resided at the interface.

Figure 11:
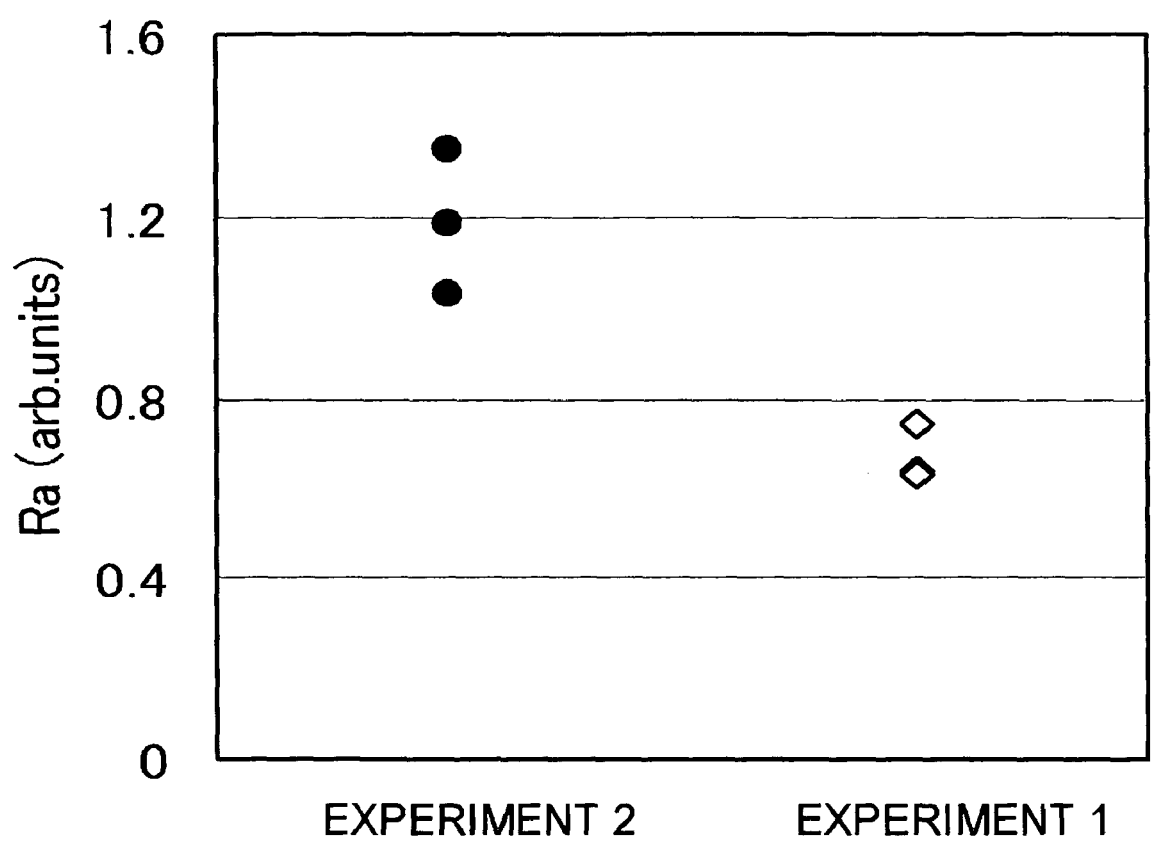
FIG. 11 is a drawing comparatively showing roughness of the interface between polysilicon composing the floating gate and the interpoly insulating film in the Experiment.

FIG. 11 is a drawing comparatively showing roughness of interfaces between the floating gate polysilicon and interpoly insulating film of the non-volatile memory elements of Experiment 1 and Experiment 2. The ordinate of FIG. 11 corresponds to mean roughness of the surface of the interpoly insulating film on the floating gate side, expressed by surface roughness observed under an atomic force microscope (AFM). It was found from FIG. 11 that Experiment 2 showed a large roughness of the interface between the interpoly insulating film and the floating gate, and thereby an oxide film having a lot of oxygen-vacant lattice points was formed. In contrast, Experiment 1 showed thickening of the HTO film because the oxidation occurs simultaneously with the nitriding. It was also found that the traps could be improved by introduction of nitrogen, together with reduction in the surface roughness by virtue of the interfacial thickening and removal of the dangling bonds.

As has been described in the above, the non-volatile memory element 110 of Experiment 1 showed distinctive synergistic effects by simultaneously carrying out the nitriding and oxidation of the HTO film under the condition containing NO and $O_2$, beyond the level independently achievable by Experiment 2 and Experiment 3. A distinctive advantage was also confirmed over Experiment 4, in which the NO treatment and the $O_2$ treatment are sequentially and separately carried out. More specifically, the non-volatile memory element 110 of Experiment 1 makes it possible to improve the traps by virtue of introduction of nitrogen, together with reduction in the surface roughness by virtue of the thickening and removal of the dangling bonds.

It is apparent that the present invention is not limited to the above embodiments, that may be modified and changed without departing from the scope and spirit of the invention.

What is claimed is:
1. A method of fabricating a non-volatile memory element comprising:
providing a floating gate on a channel-forming region in a vicinity of a surface of a semiconductor substrate;
providing an insulating film in contact with said floating gate; and providing a control gate so as to contact with said insulating film and so as to be opposed to at least a part of said floating gate, wherein said providing the insulating film comprises:

forming said insulating film on said semiconductor substrate; and exposing, subsequently to said forming the insulating film, said insulating film to an atmosphere consisting of two types of gases, one of said two types of gases comprises a nitrogen-containing gas and an other one of said two types of gases comprises oxygen gas, to thereby simultaneously proceed nitriding and oxidation of said insulating film.

2. The method of fabricating a non-volatile memory element as claimed in claim 1, wherein said exposing said insulating film to the atmosphere containing the nitrogen-containing gas and oxygen, to thereby simultaneously proceed nitriding and oxidation of said insulating film comprises heating said insulating film in an atmosphere containing NO and $O_2$.

3. The method of fabricating a non-volatile memory element as claimed in claim 2, wherein said forming of said insulating film comprises forming a high temperature oxidation (HTO) film by a reduced-pressure chemical vapor deposition (CVD) process.

4. The method of fabricating a non-volatile memory element as claimed in claim 2, wherein a ratio of flow rate $O_2$ to NO to said atmosphere is greater than 0.2 and less than 10.

5. The method of fabricating a non-volatile memory element as claimed in claim 1, wherein said exposing said insulating film to the atmosphere containing the nitrogen-containing gas and oxygen, to thereby simultaneously proceed nitriding and oxidation of said insulating film comprises heating said insulating film in an atmosphere containing $N_2O$ and $O_2$.

6. The method of fabricating a non-volatile memory element as claimed in claim 5, wherein said forming of said insulating film comprises forming a high temperature oxidation (HTO) film by a reduced-pressure chemical vapor deposition (CVD) process.

7. The method of fabricating a non-volatile memory element as claimed in claim 1, wherein said exposing of said insulating film to the atmosphere containing the nitrogen-containing gas and oxygen, to said simultaneously nitriding and oxidation of said insulating film comprises smoothing the surface of said insulating film in a portion in contact with said floating gate.

8. The method of fabricating a non-volatile memory element as claimed in claim 1, wherein said exposing of said insulating film to the atmosphere containing the nitrogen-containing gas and oxygen, to said simultaneously nitriding and oxidation of said insulating film comprises allowing said insulating film to grow in the thickness-wise direction of said insulating film by oxidation of said insulating film.

9. The method of fabricating a non-volatile memory element as claimed in claim 8, wherein said allowing of said insulating film to grow in the thickness-wise direction of said insulating film comprises thickening said insulating film by 0.3 nm or more and 3 nm or less.

10. The method of fabricating a non-volatile memory element as claimed in claim 1, wherein said forming of said insulating film comprises forming a high temperature oxidation (HTO) film by a reduced-pressure chemical vapor deposition (CVD) process.

11. The method of fabricating a non-volatile memory element as claimed in claim 10, wherein said forming of the HTO film is at a pressure of 150 Pa or less and at a temperature in a range from 800° C. to 850° C.

12. The method of fabricating a non-volatile memory element as claimed in claim 10, wherein in said forming of the HTO film, $SiH_4$ or $SiHCl_2$ is used as a Si-containing gas and $N_2O$ is used as an oxygen-containing gas.

13. The method of fabricating a non-volatile memory element as claimed in claim 1, wherein said exposing of said insulating film comprises annealing said insulating film at a temperature between 750° C. to 880° C.

14. The method of fabricating a non-volatile memory element as claimed in claim 1, wherein in said exposing of said insulating film, a concentration of nitrogen in said atmosphere is more than 1% and less than 3%.

15. The method of fabricating a non-volatile memory element as claimed in claim 1, further comprising:

forming a first high temperature oxidation (HTO) film, different from said insulating film, on an upper surface of said floating gate, said first HTO film being in contact with said insulating film and said upper surface of said floating gate.

16. The method of fabricating a non-volatile memory element as claimed in claim 15, further comprising:

forming a second high temperature oxidation (HTO) film, different from said insulating film, on an entirety of a first side of said floating gate, said insulating film being in contact with an entirety of a second side of said floating gate and a portion of said upper surface of the floating gate.

17. The method of fabricating a non-volatile memory element as claimed in claim 1, wherein said insulating film covers, and is in a direct contact with, an entirety of a lowest surface of the control gate.

18. A method of fabricating a non-volatile memory element, comprising:

providing a floating gate on a channel-forming region in a vicinity of a surface of a semiconductor substrate;

providing a first high temperature oxidation (HTO) film in contact with a first portion of an upper surface of said floating gate;

providing an insulating film in contact with a second portion of said upper surface of said floating gate, said insulating film being different from the first HTO film; and providing a control gate to contact with said insulating film, wherein said providing the insulating film comprises:

forming said insulating film on said semiconductor substrate by a reduced-pressure chemical vapor deposition (CVD) process; and modifying said insulating film by exposing, subsequently to said forming the insulating film, said insulating film to an atmosphere consisting of two types of gases, one of said two types of gases comprises a nitrogen-containing gas and an other one of said two types of gases comprises oxygen gas, to thereby simultaneously proceed nitriding and oxidation of said insulating film.

19. The method of fabricating a non-volatile memory element as claimed in claim 18, further comprising:

providing a second high temperature oxidation (HTO) film, different from said insulating film, on an entirety of a first side of said floating gate, said insulating film being in contact with an entirety of a second side of said floating gate, wherein said insulating film covers, and is in a direct contact with, an entirety of a lowest surface of the control gate.

20. A method of fabricating a non-volatile memory element comprising:
   providing a floating gate on a channel-forming region in a vicinity of a surface of a semiconductor substrate;
   providing a first high temperature oxidation (HTO) film in contact with a first portion of an upper surface of said floating gate;
   providing an insulating film in contact with a second portion of said upper surface of said floating gate, said insulating film being different from the first HTO film;
   providing a second high temperature oxidation (HTO) film, different from said insulating film, on an entirety of a first side of said floating gate, said insulating film being in contact with an entirety of a second side of said floating gate; and
   providing a control gate to contact with said insulating film, said insulating film covering, and being in a direct contact with, an entirety of a lowest surface of the control gate and an entirety of an end side surface of the floating gate,
   wherein said providing the insulating film comprises:
      forming said insulating film on said semiconductor substrate by a reduced-pressure chemical vapor deposition (CVD) process; and
      modifying said insulating film by exposing, after said forming the insulating film, said insulating film to an atmosphere consisting of two types of gases, one of said two types of gases comprises a nitrogen-containing gas and an other one of said two types of gases comprises oxygen gas, to thereby simultaneously proceed nitriding and oxidation of said insulating film.

* * * * *